US010497534B2

(12) United States Patent
Lee et al.

(10) Patent No.: US 10,497,534 B2
(45) Date of Patent: Dec. 3, 2019

(54) APERTURE SYSTEM OF ELECTRON BEAM APPARATUS, ELECTRON BEAM EXPOSURE APPARATUS, AND ELECTRON BEAM EXPOSURE APPARATUS SYSTEM

(71) Applicant: Samsung Electronics Co., Ltd., Suwon-si (KR)

(72) Inventors: Hyun Ho Lee, Hwaseong-si (KR); Jong Mun Park, Hwaseong-si (KR); Byoung Sup Ahn, Seongnam-si (KR); Jin Choi, Seoul (KR); Shuichi Tamamushi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/003,870

(22) Filed: Jun. 8, 2018

(65) Prior Publication Data

US 2019/0180972 A1 Jun. 13, 2019

(30) Foreign Application Priority Data

Dec. 12, 2017 (KR) ........................ 10-2017-0170300

(51) Int. Cl.
*H01J 37/10* (2006.01)
*H01J 37/09* (2006.01)
*H01J 37/317* (2006.01)

(52) U.S. Cl.
CPC .............. *H01J 37/09* (2013.01); *H01J 37/10* (2013.01); *H01J 37/3174* (2013.01); *H01J 2237/0451* (2013.01); *H01J 2237/24507* (2013.01)

(58) Field of Classification Search
CPC ........ H01J 37/09; H01J 37/10; H01J 37/3174; H01J 2237/0451; H01J 2237/24507
USPC ............. 250/306, 307, 309, 310, 311, 492.1, 250/492.2, 492.21, 492.22, 492.23, 492.3
See application file for complete search history.

(56) References Cited

U.S. PATENT DOCUMENTS 4,200,794 A * 4/1980 Newberry ................. H01J 9/02 216/12
6,642,646 B1 * 11/2003 Kwon ................... H01J 29/503 313/409
7,190,823 B2 * 3/2007 Chen .................. G03F 7/70633 257/758

(Continued)

FOREIGN PATENT DOCUMENTS

JP 2001-142193 A 5/2001
KR 10-0209369 B1 7/1999

(Continued)

*Primary Examiner* — Nicole M Ippolito
(74) *Attorney, Agent, or Firm* — Muir Patent Law, PLLC

(57) ABSTRACT

An aperture system of an electron beam apparatus includes a plurality of apertures each including a first area including at least one through hole allowing an electron beam to pass therethrough and a second area disposed outside the first area and including first and second alignment keys, wherein two apertures, among the plurality of apertures, include the first alignment keys arranged in mutually overlapping positions and having the same size, and an aperture, excluding the two apertures, among the plurality of apertures, includes the second alignment keys arranged to overlap the first alignment keys and having an area larger than an area of the first alignment keys.

20 Claims, 12 Drawing Sheets

100A 110
120
G1
130
140
G2
150(G3)
EB
BH
EB
130
140
164
162

(56) References Cited

U.S. PATENT DOCUMENTS

| | | | | |
|---|---|---|---|---|
| 8,648,318 | B2 | 2/2014 | Kruit et al. | |
| 9,177,793 | B2 * | 11/2015 | Kim | H01L 21/027 |
| 2018/0151850 | A1 * | 5/2018 | Lee | H01L 27/3206 |

FOREIGN PATENT DOCUMENTS

| | | | |
|---|---|---|---|
| KR | 10-474141 | B1 | 3/2003 |
| KR | 10-2007-0001746 | A | 1/2007 |
| KR | 10-2009-0091214 | A | 8/2009 |
| WO | WO 2006/033544 | A1 | 3/2006 |

* cited by examiner

APERTURE SYSTEM OF ELECTRON BEAM APPARATUS, ELECTRON BEAM EXPOSURE APPARATUS, AND ELECTRON BEAM EXPOSURE APPARATUS SYSTEM

CROSS-REFERENCE TO RELATED APPLICATION(S)

This application claims benefit of priority under 35 U.S.C. § 119 to Korean Patent Application No. 10-2017-0170300, filed on Dec. 12, 2017, in the Korean Intellectual Property Office, the disclosure of which is incorporated herein by reference in its entirety.

BACKGROUND

1. Field

The disclosure relates to an aperture system of an electron beam apparatus, and an electron beam exposure apparatus and an electron beam exposure apparatus system including the same.

2. Description of Related Art

An electron beam apparatus is used to form a pattern on a substrate or to analyze a pattern during a semiconductor manufacturing process. An electron beam exposure apparatus, among such apparatuses, forms a single shot or a single beam mainly using an electron beam emitted from a single electron gun and performs patterning using the shot or beam. Recently, however, in order to manufacture highly integrated semiconductor devices at high yield, there have been developed apparatuses forming multiple beams by separately controlling a plurality of electron beams emitted from a plurality of electron guns or allowing an electron beam emitted from a single electronic gun to pass through a plurality of apertures.

SUMMARY

An aspect is to provide an aperture system of an electron beam apparatus with improved accuracy, and an electron beam exposure apparatus and an electron beam exposure apparatus system including the same.

In some embodiments, this disclosure is directed to an aperture system of an electron beam apparatus, the aperture system comprising: a plurality of aperture sheets, each of the plurality of apertures sheets including a first area including at least one through hole allowing an electron beam to pass therethrough and a second area disposed outside the first area and including first and second alignment keys, wherein first and second aperture sheets, among the plurality of aperture sheets, respectively include the first alignment keys arranged in mutually overlapping positions and having the same size, and wherein a third aperture sheet, among the plurality of aperture sheets, includes the second alignment keys arranged to overlap the first alignment keys and having an area larger than an area of the first alignment keys.

In some embodiments, this disclosure is directed to an electron beam exposure apparatus comprising: an electron gun emitting an electron beam toward a substrate; a lens unit arranged between the substrate and the electron gun and focusing the electron beam; and a plurality of aperture sheets arranged between the substrate and the lens unit, wherein first and second aperture sheets, among the plurality of aperture sheets, each include first alignment keys arranged in mutually overlapping positions and having the same size, and wherein at least one third aperture sheet, among the plurality of aperture sheets, includes second alignment keys arranged to overlap the first alignment keys and having an area larger than an area of the first alignment keys.

In some embodiments, this disclosure is directed to an electron beam exposure apparatus system comprising: a plurality of aperture sheets each including a first area including at least one through hole allowing an electron beam to pass therethrough and a second area including first and second alignment keys arranged outside the first area; a measurement unit measuring the intensity of the electron beam passing through the plurality of aperture sheets; and an adjustment unit adjusting positions of the plurality of aperture sheets, wherein first and second aperture sheets, among the plurality of aperture sheets, include the first alignment keys arranged in mutually overlapping positions and having the same size, and wherein a third aperture sheet, among the plurality of aperture sheets, includes the second alignment keys arranged to overlap the first alignment keys and having an area larger than an area of the first alignment keys.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
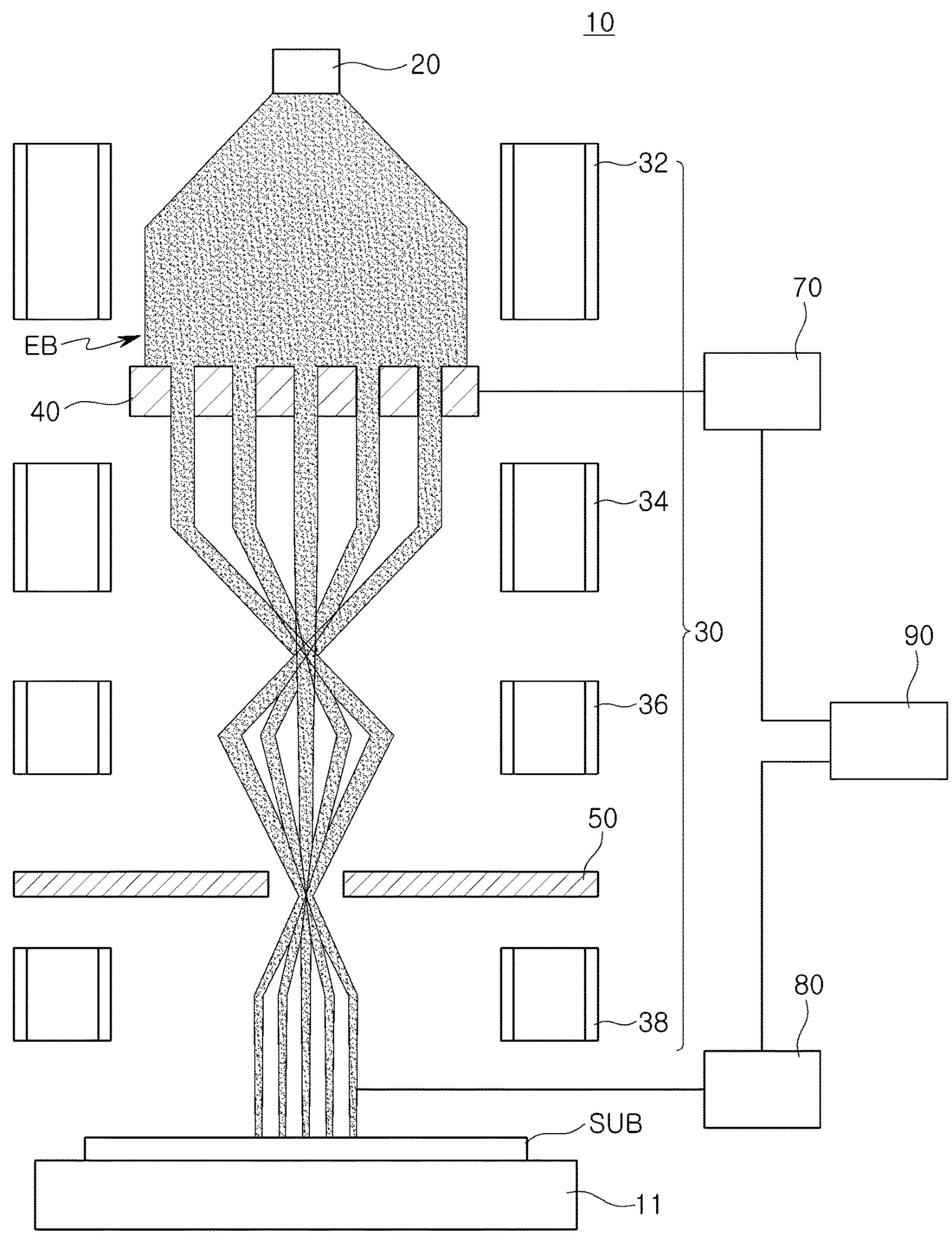
FIG. 1 is a schematic view illustrating an electron beam exposure apparatus system, according to example embodiments.

FIG. 1 is a schematic view illustrating an electron beam exposure apparatus system, according to example embodiments.

Referring to FIG. 1, an electron beam exposure apparatus system 10 includes an electron gun 20 as a source providing an electron beam EB, a stage 11 supporting substrate SUB on which a resist layer exposed by an electron beam EB is applied, lens units 30 arranged between the electron gun 20 and the stage 11 and adjusting a size of the electron beam EB, an aperture system 40 including apertures forming a cross-sectional shape of the electron beam EB, and a deflector 50. The electron beam exposure apparatus system 10 may further include an adjustment unit 70 adjusting a position of the apertures of the aperture system 40, a measurement unit 80 measuring intensity of the electron beam EB passing through the aperture system 40, and a controller 90 deriving information regarding an alignment position of aperture sheets that form the apertures based on the measured intensity of the electron beam EB from the measurement unit 80. The stage 11, the electron gun 20, the lens units 30, the aperture system 40, and the deflector 50 may constitute an electron beam exposure apparatus, and the electron beam exposure apparatus may further include the adjustment unit 70 and/or the measurement unit 80.

The stage 11 may support the substrate SUB and move the substrate SUB such that the substrate SUB is exposed to the electron beam EB. The substrate SUB may be an exposure target that is exposed to the electron beam EB and patterned. The substrate SUB is a structure to which a resist layer responsive to the electron beam EB is applied. The substrate SUB may be, for example, a semiconductor substrate such as silicon (Si) or a translucent substrate such as quartz.

The electron gun 20 may be disposed above the stage 11 on which the substrate SUB is supported. The electron gun 20 may include a filament and may emit an electron beam EB toward the substrate SUB. The electron beam EB emitted from the electron gun 20 may be accelerated by an internal accelerating electrode. The electron gun 20 may be configured as one electron gun or a plurality of electron guns.

The lens units 30 may include first to fourth lens units 32, 34, 36, and 38 sequentially disposed from the electron gun 20. For example, the first to fourth lens units 32, 34, 36, and 38 may be disposed in the vertical region between the electron gun 20 and the substrate SUB. The lens units 30 may include a condenser lens and/or a projection lens and may control or focus a path of the electron beam EB or allow the electron beam EB to be focused.

The aperture system 40 may include a plurality of aperture sheets. The aperture system 40 may allow a partial amount of an incident electron beam EB to be transmitted therethrough according to a degree to which the apertures of the aperture sheets overlap or intersect with each other, to induce an intended shape of the electron beam EB and adjust a size thereof. For example, each of the aperture sheets constituting the aperture system 40 may include openings allowing the electron beam EB to be transmitted therethrough. In the electron beam exposure apparatus system 10, the electron beam EB may be formed to have multiple beamshapes by the aperture system 40. Each of the aperture sheets included in the aperture system 40 may include alignment keys for alignment between the aperture sheets, and positions of the aperture sheets may be controlled by the adjustment unit 70 individually or collectively.

The deflector 50 deflects the electron beam EB such that the electron beam EB may be accurately irradiated to an intended pattern formation position.

The adjustment unit 70 may adjust the position of the aperture sheets of the aperture system 40. In detail, the adjustment unit 70 may shift positions of the aperture sheets to measure the intensity of the electron beam EB, and adjust the positions of the aperture sheets on the basis of information from the controller 90. For example, the adjustment unit 70 may make very small or fine adjustments to the positions of the aperture sheets.

The measurement unit 80 may measure the intensity of the electron beam EB passing through the aperture system 40. The measurement unit 80 may include, but is not limited to, at least one faraday cup, for example.

The controller 90 may store the intensity of the electron beam EB measured by the measurement unit 80, and may determine a degree of shifting of the aperture sheets on the basis of the stored intensity. The controller 90 may be, for example, a computing system including a workstation or other computing device configured to execute one or more processes. Such a workstation or computing device may include one or more of the following components: at least one central processing unit (CPU) configured to execute computer program instructions to perform various processes and methods, random access memory (RAM) and read only memory (ROM) configured to access and store data and information and computer program instructions, I/O devices configured to provide input and/or output to the computing device (e.g., keyboard, mouse, display, etc.), and storage media or other suitable type of memory, where the files that comprise an operating system, application programs, and/or other applications, and data files are stored. The computing device may be configured to perform the functions described herein, which such functions implemented in hardware, software, firmware, or any combination thereof. If implemented in software, the functions can be stored as one or more instructions or code on computer-readable medium, including the computer-readable medium described above (e.g., RAM, ROM, storage media, etc.). The method according to which the controller 90 controls alignment of the aperture sheets from the intensity of the electron beam EB measured by the measurement unit 80 will be described in detail below with reference to FIGS. 6 through 8B. Hereinafter, a method of forming a pattern using the electron beam exposure apparatus system will be briefly described.

The electron beam EB emitted from the electron gun 20 may be focused by the first lens unit 32 to have directionality toward the substrate SUB. The electron beam EB, while passing through the aperture system 40, may be shaped as multiple beams and continue to be focused by the second and third lens units 34 and 36 to travel in the direction of the substrate SUB. Thereafter, the electron beam EB may be partially blocked or adjusted in traveling direction by the deflector 50 and focused by the fourth lens unit 38 to reach the substrate SUB on the stage 11. The electron beam EB may reach the substrate SUB as multiple beams and may selectively expose a region of the resist layer of the substrate SUB, while scanning the substrate SUB. The exposed substrate SUB may have a patterned layer through a subsequent or follow-up process, such as a development process or the like.

Figure 2:
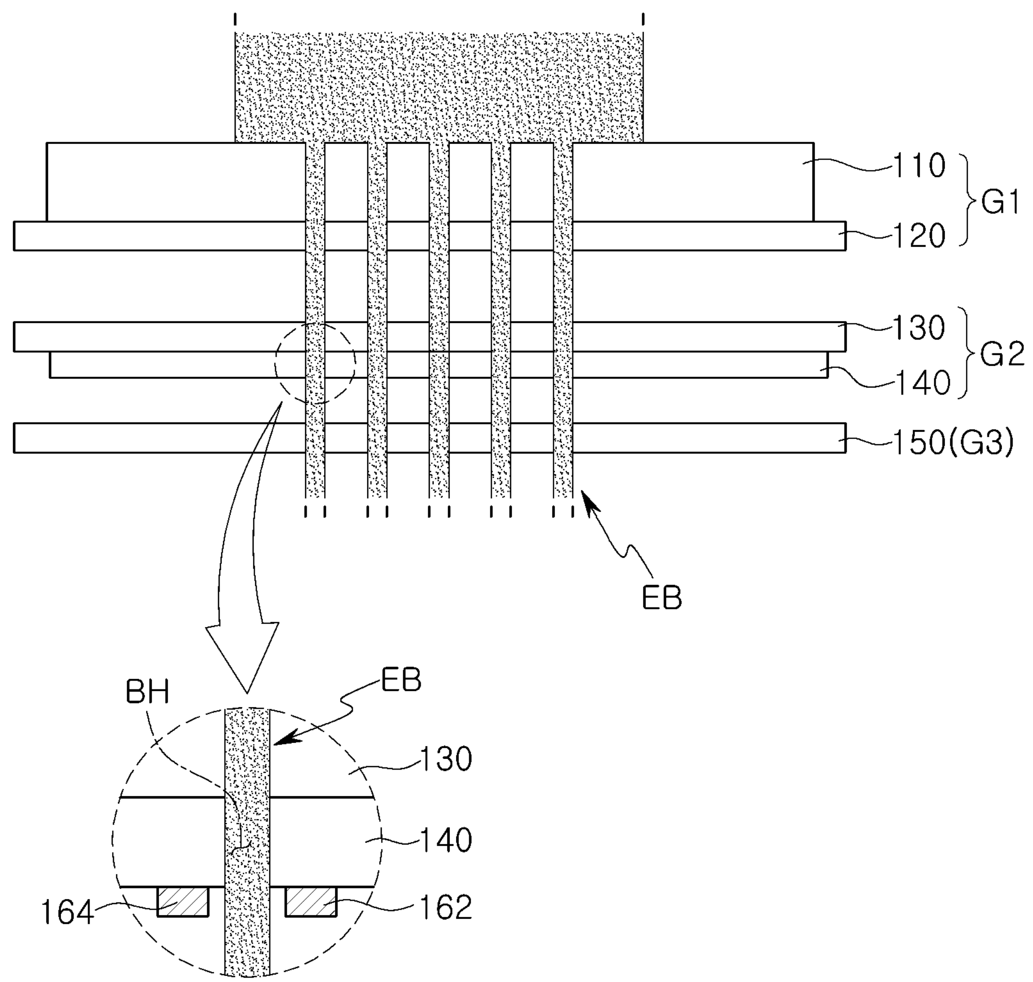
FIG. 2 is a schematic cross-sectional view of an aperture system, according to example embodiments.

FIG. 2 is a schematic cross-sectional view of an aperture system according to example embodiments.

Referring to FIG. 2, the aperture system 100 may include a plurality of aperture sheets 110 to 150 stacked vertically. The aperture system 100 may correspond, for example, to the aperture system 40 of FIG. 1. Alternatively, the aperture system 100 may be applied to an electron beam apparatus other than the electron beam exposure apparatus. The aperture system 100 may be variously applied to an electron beam apparatus including a plurality of aperture sheets, such as, for example, an electron beam inspection apparatus, or the like.

The aperture system 100 may include first to third aperture sheet groups G1, G2, and G3 spaced apart from one another vertically. For example, there may be a first vertical gap between the first aperture sheet group G1 and the second aperture sheet group G2, and a second vertical gap between the second aperture sheet group G2 and the third aperture sheet group G3. Each of the first to third aperture sheet groups G1, G2, and G3 may include at least one aperture sheet 110 to 150. The first group G1 may include two aperture sheets (e.g., first and second aperture sheets 110 and 120), and the first and second aperture sheets 110 and 120 may be disposed to be in contact with each other. The second group G2 may include two aperture sheets (e.g., third and fourth aperture sheets 130 and 140), and the third group G3 may include one aperture sheet (e.g., fifth aperture sheet 150). In example embodiments, the number of groups G1, G2, and G3 and the number of aperture sheets 110 to 150 included in each of the groups G1, G2, and G3 may be varied. The aperture sheets 110 to 150 may be relatively thin layers of material, and each aperture sheet 110 to 150 may include a plurality of apertures. The apertures may be openings in the aperture sheets 110 to 150 and may be referred to herein as through holes BH.

The first to fifth aperture sheets 110 to 150 may include through holes BH, which are openings or apertures allowing the electron beam EB incident from above to pass therethrough. In the first through fifth aperture sheets 110 to 150, the same amount or different amounts of the through holes BH are provided and the through holes BH may have the same shape or different shapes. The electron beam EB may pass through the through holes BH within a range in which the through holes BH overlap. The first through fifth aperture sheets 110 to 150 may perform different functions. For example, the first aperture sheet 110 may be a shaping aperture sheet and the fourth aperture sheet 140 may be a blanking aperture sheet. The second, third, and fifth aperture sheets 120, 130, and 150 may serve to block scattered electrons traveling in an undesired direction or block electromagnetic waves generated in the vicinity of the electron beam EB. In a case where the fourth aperture sheet 140 is a blanking aperture, the fourth aperture sheet 140 may be arranged to be connected to first and second electrodes 162 and 164 as illustrated in the enlarged view of FIG. 2. The first and second electrodes 162 and 164 are spaced apart from one another in the vicinity of each of the through holes BH and control a direction of the electron beam EB passing through the through holes BH of the fourth aperture sheet 140 according to an applied electrical signal. For example, each through hole BH may have first and second electrodes 162 and 164 provided on a bottom surface of the fourth aperture sheet 140 on either side of the through hole BH, and electrical signals may be independently supplied to the first and second electrodes 162 and 164 to selectively control the direction of the electron beam EB that passes through the individual through holes BH.

Since the aperture system 100 includes the plurality of aperture sheets 110 to 150, a final shape and size of the electron beam EB may be changed by alignment of the aperture sheets 110 to 150 relative to one another. Therefore, alignment of the aperture sheets 110 to 150 allows for improved accuracy of the electron beam EB. In example embodiments, alignment of the aperture sheets 110 to 150 may be made by alignment keys included in at least some of the aperture sheets 110 to 150, and the aperture sheets 110 to 150 may be adjusted individually or by groups G1, G2, and G3. The alignment keys will be described in detail with reference to FIGS. 3A through 4 hereinafter.

Figure 3A:
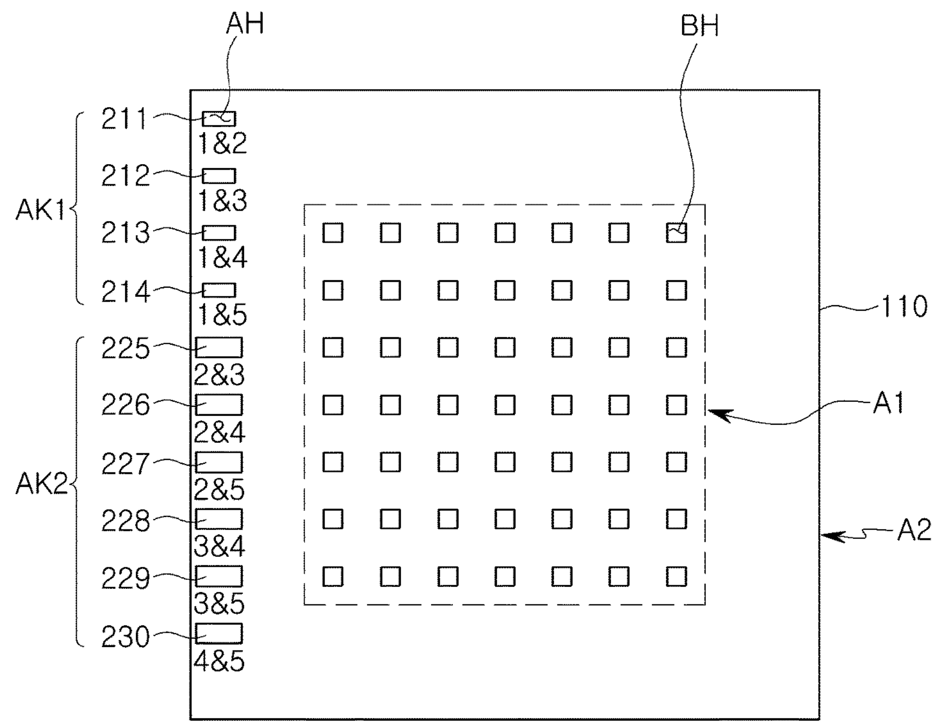
FIGS. 3A through 3C are schematic plan views of an aperture system, according to example embodiments.
Figure 3B:
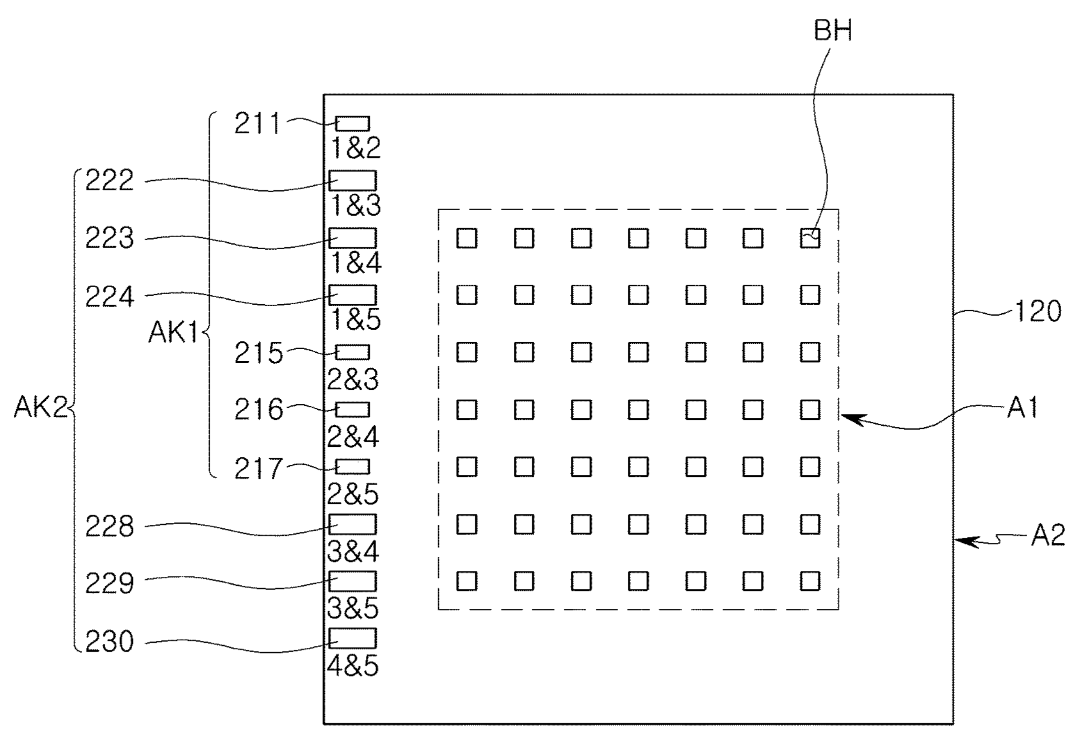
Figure 3C:
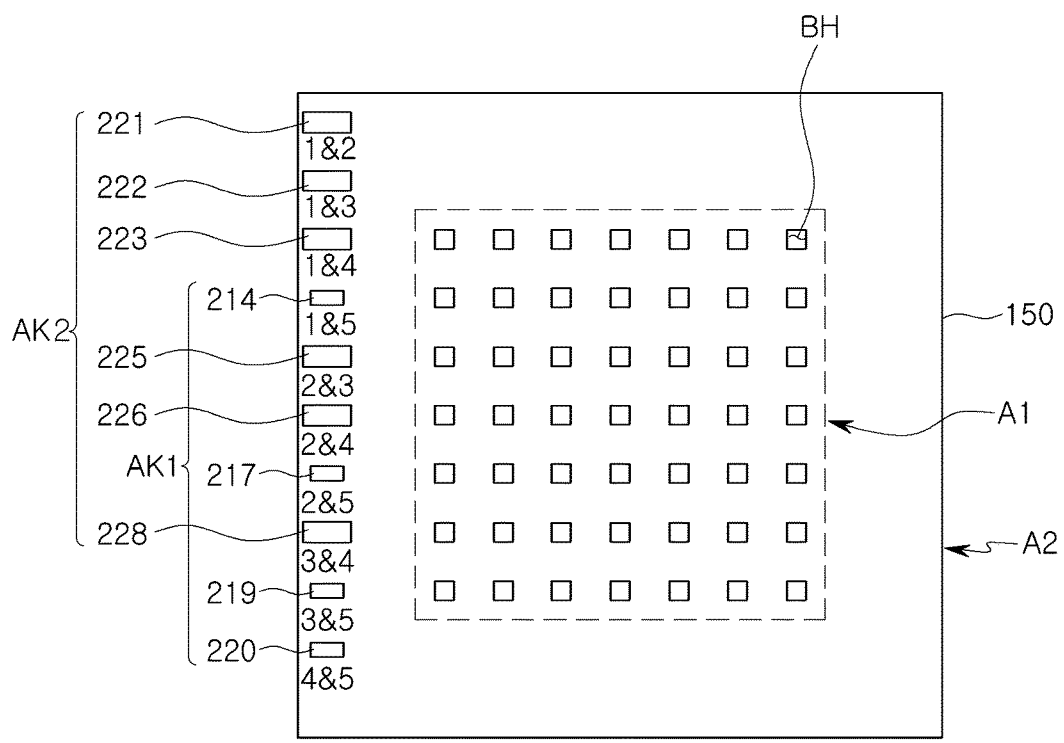

FIGS. 3A through 3C are schematic plan views of an aperture system according to example embodiments.

Figure 4:
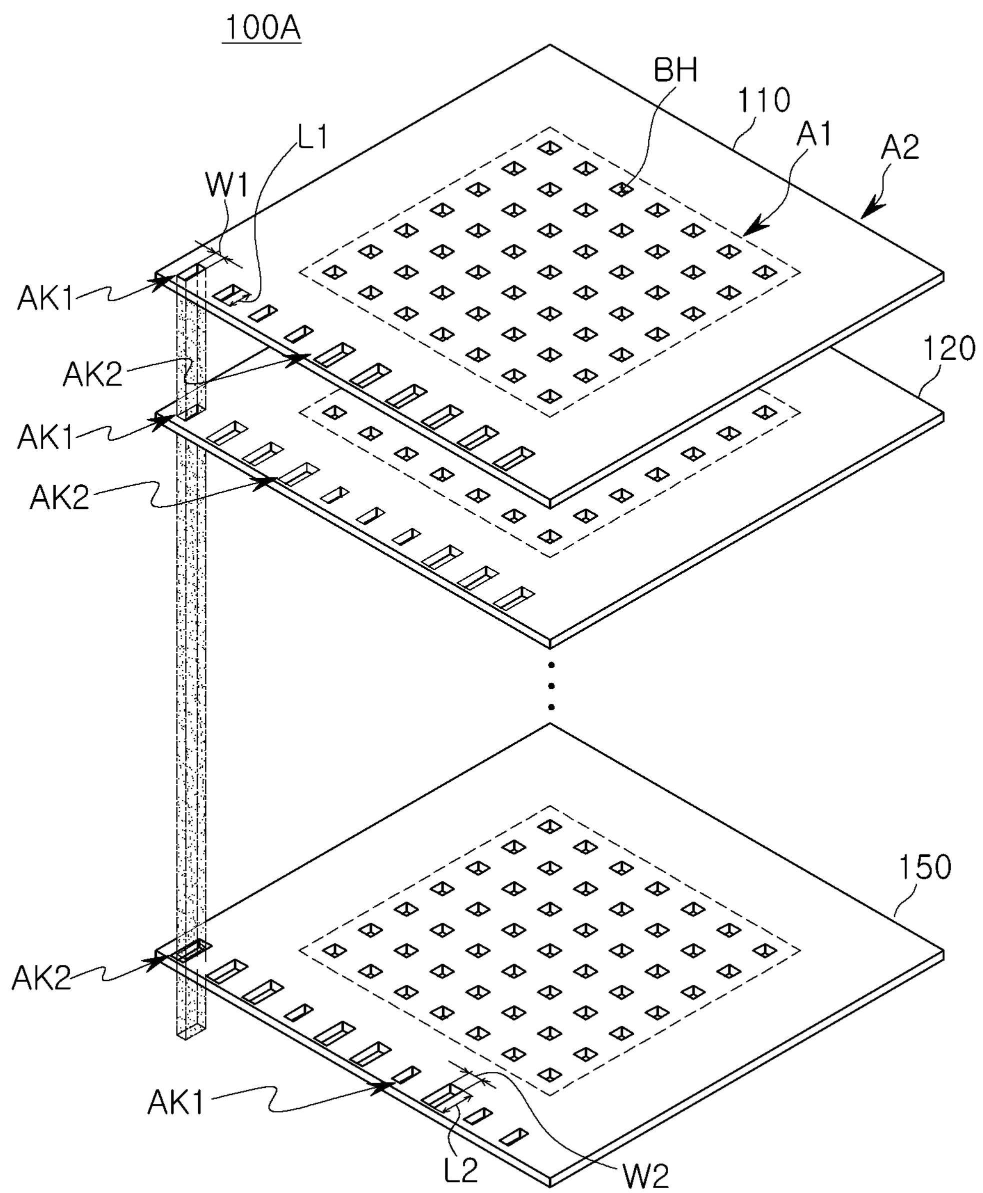
FIG. 4 is a schematic exploded perspective view of an aperture system, according to example embodiments.

FIG. 4 is a schematic exploded perspective view of an aperture system according to example embodiments.

Referring to FIGS. 3A through 4, in order to explain an arrangement of exemplary alignment keys of the aperture sheets 110 to 150 of an aperture system 100A as illustrated in FIG. 2, the first, second, and fifth aperture sheets 110, 120, and 150 are illustrated. The aperture system 100A may include five aperture sheets 110 to 150 including the alignment keys, and may further include aperture sheets without the alignment keys.

The aperture sheets 110 to 150 may include a first area A1 including the plurality of through holes BH through which the electron beam passes and a second area A2 disposed outside of the first area A1 and including first and second alignment keys AK1 and AK2 through which the electron beam passes. In some embodiments, the second area A2 may surround the first area A1. The first area A1 may be an area of the aperture sheets 110 to 150 through which an electron beam for forming a pattern on the substrate passes, and thus the first area A1 may correspond to the area of the substrate on which the pattern is formed. The second area A2 may correspond to a dummy area of the substrate on which an electron beam substantially does not form a pattern. For example, the electron beam that has passed through the second area A2 may reach a dummy area of the substrate, may reach the outside of the substrate, or may not reach the substrate. When the electron beam that has passed through the second area A2 does not reach the substrate, the measurement unit 80 of FIG. 1 may measure the electron beam at the lower end of the aperture system 40.

The plurality of through holes BH may be arranged in the first area A1, and the amount and arrangement type of the through holes BH may be varied in terms of the example embodiments. According to example embodiments, the sizes, shapes, and numbers of the through holes BH in the aperture sheets 110 to 150 may be different from each other.

A plurality of first and second alignment keys AK1 and AK2 may be disposed in the second area A2. The first and second alignment keys AK1 and AK2 are in the form of openings extending through aperture sheets 110 to 150 to allow the electron beam to pass therethrough, and may be arranged in rows and/or columns. The first and second alignment keys AK1 and AK2 may have rectangular shapes extending lengthwise in the same direction, but the disclosure is not limited thereto.

The first alignment keys AK1 may be keys that measure alignment of any two of the aperture sheets 110 to 150, and may be arranged to overlap each other in corresponding positions or same positions of a specific two different ones of the aperture sheets 110 to 150. The second alignment keys AK2 may be arranged to overlap the first alignment keys AK1 in the remainder of the aperture sheets 110 to 150 other than the specific two different aperture sheets of aperture sheets 110 to 150. The second alignment keys AK2 may have a larger area than the first alignment keys AK1 so that the electron beam passing through the first alignment keys AK1 may pass through the second alignment keys AK2 without being blocked. For example, although misalignment may occur between the specific two different aperture sheets of the aperture sheets 110 to 150, the electron beam, which has passed through the overlapped area of the first alignment keys AK1 of the specific two aperture sheets, may pass through the remainder of the aperture sheets 110 to 150 without being blocked by the second alignment keys AK2.

The first alignment keys AK1 may be arranged to correspond to the number of combinations of each pair of the aperture sheets 110 to 150. For example, in the embodiment of FIG. 2, the first aperture sheet 110 may have four first alignment keys AK1 arranged therein in order to measure alignment with each of the second to fifth aperture sheets 120 to 150. For example, if the aperture system 100A includes n aperture sheets which are required to be analyzed in terms of alignment therebetween, since the number of alignment keys included in one aperture sheet represents a combination of two aperture sheets, among the n aperture sheets, then the number of alignment keys on each alignment sheet may be $nC_2=n(n-1)/2=(n^2-n)/2$. Among the total number of alignment keys, the number of the first alignment keys AK1 may be n−1 and the number of the second alignment keys AK2 may be the remaining alignment keys.

As illustrated in FIGS. 3A through 3C, in each of the aperture sheets 110 to 150, the first alignment keys AK1 may include first to tenth keys 211 to 220, and the second alignment keys AK2 may include first to tenth keys 221 to 230. The first to tenth keys 210 to 220 and the first to tenth keys 221 to 230 may be arranged sequentially in numerical order.

The first to tenth keys 211 to 220 of the first alignment keys AK1 may be arranged, from above, in order of a first key 211 for measuring alignment of the first and second aperture sheets 110 and 120, a second key 212 for measuring alignment of the first and third aperture sheets 110 and 130, a third key 213 for measuring alignment of the first and fourth aperture sheets 110 and 140, and so on, as illustrated in Table 1. For each aperture sheet 110 to 150, the first alignment keys AK1 may be the keys to align that specific aperture sheet with each of the other remaining aperture sheets. For example, on the first aperture sheet 110, the first alignment keys AK1 may be the keys 211 to 214, which respectively align the first aperture sheet 110 to each of the remaining aperture sheets 120 to 150, and the second alignments keys AK2 may be keys 225-230, which align the remaining aperture sheets 120 to 150 to one another. On the second aperture sheet 120, the first alignment keys AK1 may be keys 211 and 215-217, which respectively align the second aperture sheet 120 to the remaining aperture sheets 110 and 130 to 150, and the second alignment keys AK2 may be keys 222 to 224 and 228 to 230, which align the remaining aperture sheets 110 and 130 to 150 to one another. The third through fifth aperture sheets 130 to 150 may be similarly arranged, as illustrated in Table 1 below. Thus, each of the first to fifth aperture sheets 110 to 150 may include four first alignment keys AK1 and six second alignment keys AK2. For each of the first to fifth aperture sheets 110 to 150, the first to tenth keys 221 to 230 of the second alignment keys AK2 may be arranged in positions in which the first alignment keys AK1 are not arranged.

TABLE 1

Configuration of first and second alignment keys AK1 and AK2 in first to fifth aperture sheets 110 to 150

| | First Aperture Sheet | Second Aperture Sheet | Third Aperture Sheet | Fourth Aperture Sheet | Fifth Aperture Sheet |
|---|---|---|---|---|---|
| First key (1 & 2) | ● | ● | ◎ | ◎ | ◎ |
| Second key (1 & 3) | ● | ◎ | ● | ◎ | ◎ |
| Third key (1 & 4) | ● | ◎ | ◎ | ● | ◎ |
| Fourth key (1 & 5) | ● | ◎ | ◎ | ◎ | ● |
| Fifth key (2 & 3) | ◎ | ● | ● | ◎ | ◎ |
| Sixth key (2 & 4) | ◎ | ● | ◎ | ● | ◎ |
| Seventh key (2 & 5) | ◎ | ● | ◎ | ◎ | ● |
| Eighth key (3 & 4) | ◎ | ◎ | ● | ● | ◎ |
| Ninth key (3 & 5) | ◎ | ◎ | ● | ◎ | ● |
| Tenth key (4 & 5) | ◎ | ◎ | ◎ | ● | ● |

(●: First alignment key (AK1), ◎ Second alignment key (AK2))

As illustrated in FIG. 4, in each of the aperture sheets 110 to 150, among the first and second alignment keys AK1 and AK2 disposed in the same or corresponding positions, the first alignment keys AK1 may have the same size and shape as one another, and the first alignment keys AK1 and the second alignment keys AK2 may have different sizes from one another. The first alignment key AK1 may have a first length L1 in a first direction and a first width W1 in a second direction that is perpendicular to the first direction. The second alignment key AK2 may have a second length L2 larger than the first length L1 in the first direction and a second width W2 larger than the first width W1 in the second direction that is perpendicular to the first direction.

Since the second alignment keys AK2 have an area larger than the first alignment keys AK1, although misalignment occurs between the aperture sheets 110 to 150, that is, although the first alignment keys AK1 corresponding to each other in the vertical direction do not accurately match in position, the electron beam, which has passed through the first alignment keys AK1, may entirely pass through the second alignment keys AK2. Accordingly, the electron beam, which has passed through the first alignment keys AK1, may reach a lower side of the aperture sheets 110 to 150, without being affected, for example, without being blocked by the second alignment keys AK2.

In the present example embodiment, it is illustrated that all five aperture sheets 110 to 150 constituting the aperture system 100A have the first and second alignment keys AK1 and AK2, but in example embodiments, the number of aperture sheets constituting the aperture system 100A and the number of aperture sheets having the first and second alignment keys AK1 and AK2 may be varied. For example, only some of the aperture sheets constituting the aperture system 100A may have the first and second alignment keys AK1 and AK2. For example, only one aperture sheet in each of aperture sheet groups (e.g., aperture sheet groups G1, G2, and G3 of FIG. 2) may have the first and second alignment keys AK1 and AK2 in order to control alignment between the aperture sheet groups.

Figure 5A:
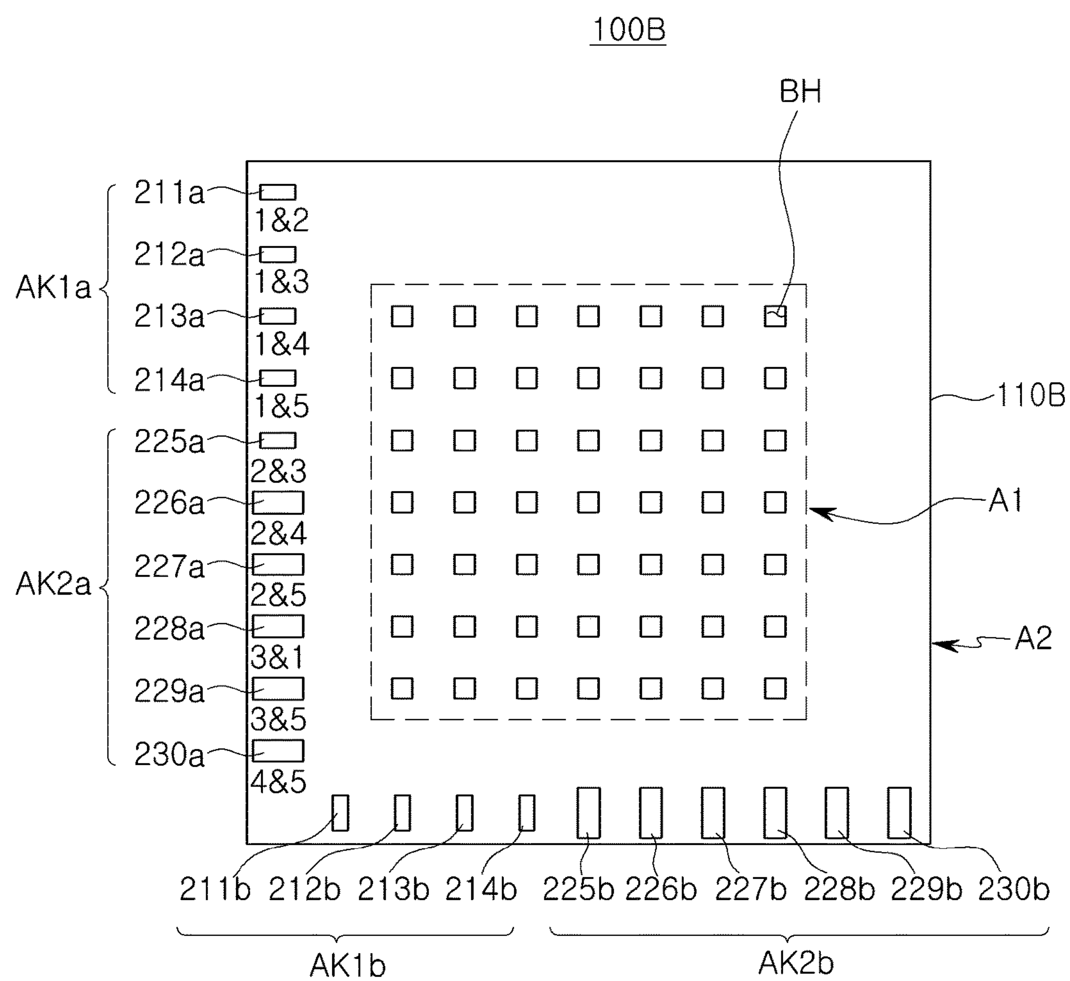
FIGS. 5A through 5C are schematic plan views of an aperture constituting an aperture system, according to example embodiments.
Figure 5B:
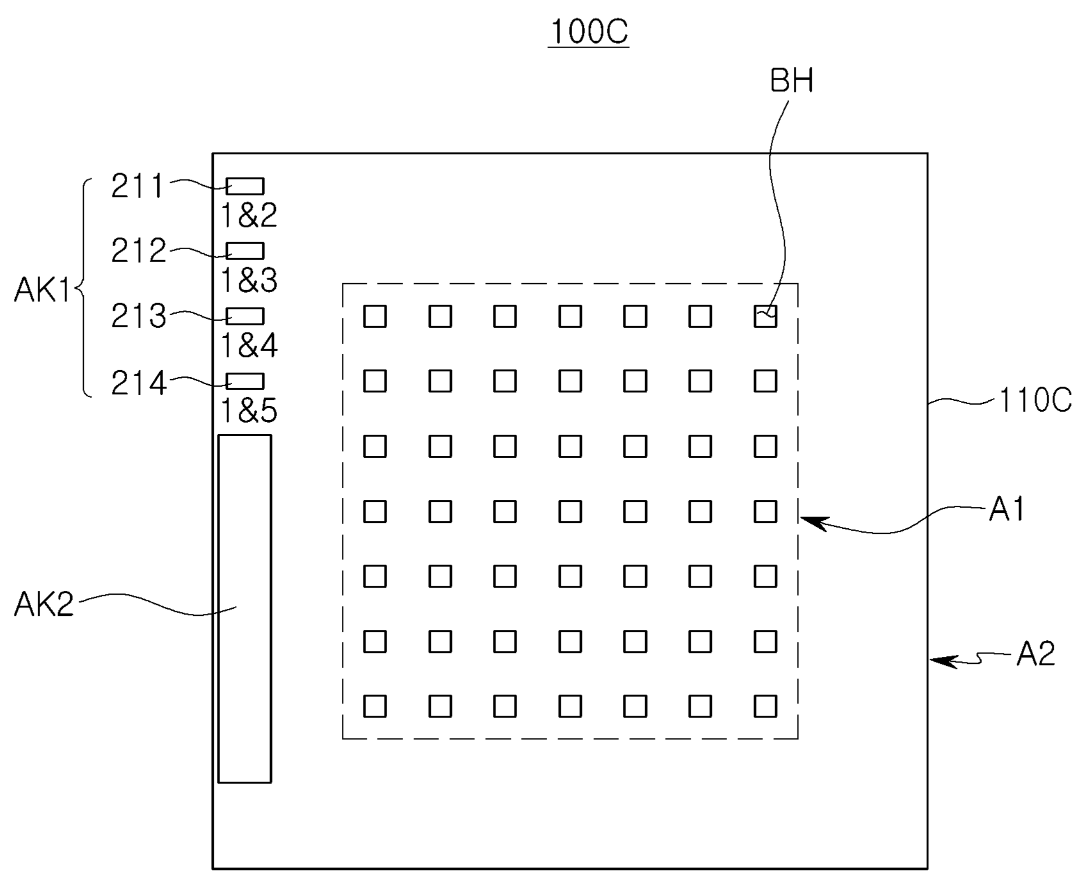
Figure 5C:
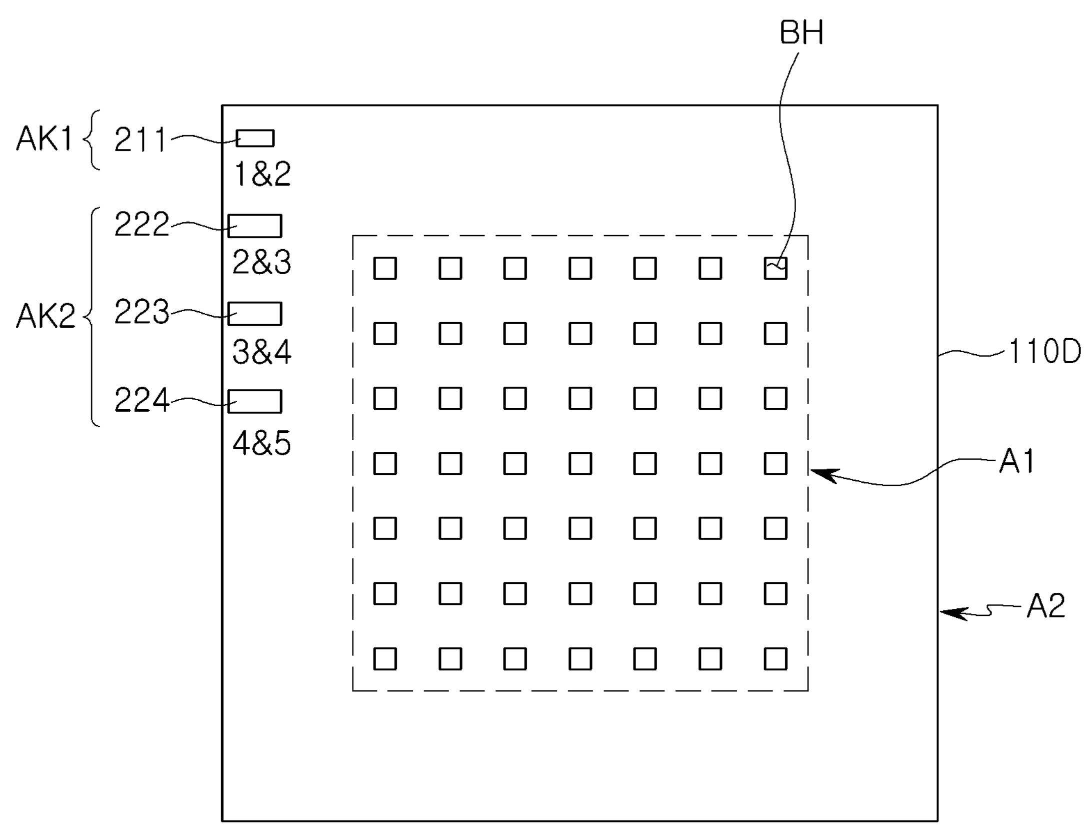

FIGS. 5A through 5C are schematic plan views of aperture sheets constituting an aperture system according to example embodiments.

Referring to FIG. 5A, the aperture sheet 110B constituting an aperture system 100B may include first and second alignment keys AK1*a*, AK1*b*, AK2*a* and AK2*b*. Unlike the example embodiment of FIG. 3, in addition to the first and second horizontal alignment keys AK1*a* and AK2*a* disposed on one side of the first area and extending in the first direction, the aperture sheet 110B of the present example embodiment may further include first and second vertical alignment keys AK1*b* and AK2*b* arranged on some other side of the first area A1 and extending in a second direction perpendicular to a first direction.

The first and second horizontal alignment keys AK1$a$ and AK2$a$ may be disposed on the left side of the first area A1 and the first and second vertical alignment keys AK1$b$ and AK2$b$ may be disposed on the lower side of the first area A1 but the embodiments are not limited thereto.

The first and second vertical alignment keys AK1$b$ and AK2$b$ may have a rectangular shape extending lengthwise in the second direction. The first and second vertical alignment keys AK1$b$ and AK2$b$ may also be arranged in each aperture sheet 110B to 150B in the same manner as that described above with reference to FIGS. 3A through 4. That is, the first and second vertical alignment keys AK1$b$ and AK2$b$ may include first vertical alignment keys AK1$b$ for measuring alignment of any two aperture sheets 110B to 150B, as well as other second vertical alignment keys AK2$b$.

An alignment state in the first direction may be measured and analyzed by analyzing the first and second horizontal alignment keys AK1$a$ and AK2$a$ in the first direction, and an alignment state in the second direction may be measured and analyzed by analyzing the first and second vertical alignment keys AK1$b$ and AK2$b$ in the second direction. This will be described in more detail with reference to FIGS. 7A and 7B hereinafter.

Referring to FIG. 5B, the aperture sheet 110C constituting an aperture system 100C may include first and second alignment keys AK1 and AK2. Unlike the example embodiment of FIG. 3A, the aperture sheet 110C of the present example embodiment may have a shape in which the second alignment keys AK2 are connected to each other in adjacent areas. For example, the fifth to tenth keys 225 to 230, the second alignment keys AK2 arranged adjacent to each other in the aperture sheet 110C of FIG. 3A may be arranged in a connected manner in the example embodiment of aperture sheet 100C of FIG. 5B. Also, as another example of the aperture system 100C, in the case of the aperture sheet 120C corresponding to the aperture sheet 120C of FIG. 3B, among the second alignment keys AK2, the second to fourth keys 222 to 224 may be arranged as one key and the eighth to tenth keys 228 to 230 may be arranged as one key.

As described above, since the second alignment keys AK2 are for allowing the electron beam, which has passed through the overlapping first alignment keys AK1, to pass therethrough without being blocked, the second alignment keys AK2 may be relatively large, and as in the present example embodiment, the adjacent second alignment keys AK2 may be disposed in a connected form.

Referring to FIG. 5C, the aperture sheet 110D constituting an aperture system 100D may include first and second alignment keys AK1 and AK2. Unlike the example embodiment of FIG. 3A, the aperture sheet 110D of the present example embodiment may include only a minimal number of first and second alignment keys AK1 and AK2. For example, the aperture sheet 110D of the present example embodiment may include the first alignment keys AK1 sequentially aligning the aperture sheets 110D to 150D, rather than including the first alignment keys AK1 for aligning a specific two aperture sheets 110D to 150D among the aperture sheets 110D to 150D constituting the aperture system 100A as in the example embodiment of FIGS. 3A through 4.

As illustrated in Table 2 below, the first alignment keys AK1 may include, from above, a first key 211 for measuring alignment of the first and second aperture sheets 110 and 120, a second key 212 for measuring alignment of the second and third aperture sheets 120 and 130, a third key 213 for measuring alignment of the third and fourth aperture sheets 130 and 140, and a fourth key 214 for measuring alignment of the fourth and fifth aperture sheets 140 and 150. Thus, each of the first to fifth aperture sheets 110 to 150 may include one or two first alignment keys AK1 and include two or three second alignment keys AK2. The second alignment keys AK2 may be arranged in positions in which the first alignment keys AK1 are not arranged.

TABLE 2

A minimum configuration of first and second alignment keys AK1 and AK2 in first to fifth aperture sheets 110 to 150

| | First Aperture Sheet | Second Aperture Sheet | Third Aperture Sheet | Fourth Aperture Sheet | Fifth Aperture Sheet |
|---|---|---|---|---|---|
| First key (1 & 2) | ● | ● | ◎ | ◎ | ◎ |
| Second key (2 & 3) | ◎ | ● | ● | ◎ | ◎ |
| Third key (3 & 4) | ◎ | ◎ | ● | ● | ◎ |
| Fourth key (4 & 5) | ◎ | ◎ | ◎ | ● | ● |

(●: First alignment key (AK1), ◎ Second alignment key (AK2))

For example, referring again to the embodiment of FIG. 5C, if the aperture system 100D includes n aperture sheets to be analyzed in alignment therebetween, the number of alignment keys included in one aperture sheet may be n−1. In this case, among the alignment keys, the number of the first alignment keys AK1 may be one or two, and the other remaining alignment keys may be the second alignment keys AK2.

In the case of the present example embodiment of FIG. 5C, the aperture sheets 110D to 150D of the aperture system 100D may be measured only in an alignment state with additional aperture sheets 110D to 150D. For example, aperture sheet 110D is measured in alignment only with respect to aperture sheet 120D, aperture sheet 120D is measured in alignment only with respect to aperture sheet 130D, aperture sheet 130D is measured in alignment only with respect to aperture sheet 140D, and aperture sheet 140D is measured in alignment only with respect to aperture sheet 150D. Therefore, the alignment state is to be controlled sequentially among the aperture sheets 110D to 150D. If the area of the second area A2 is relatively narrow or the number of aperture sheets constituting the aperture system 100D is relatively large so it is difficult to arrange the alignment keys between all the aperture sheets, the aperture system may be configured to include the minimum alignment keys in this manner.

Figure 6:
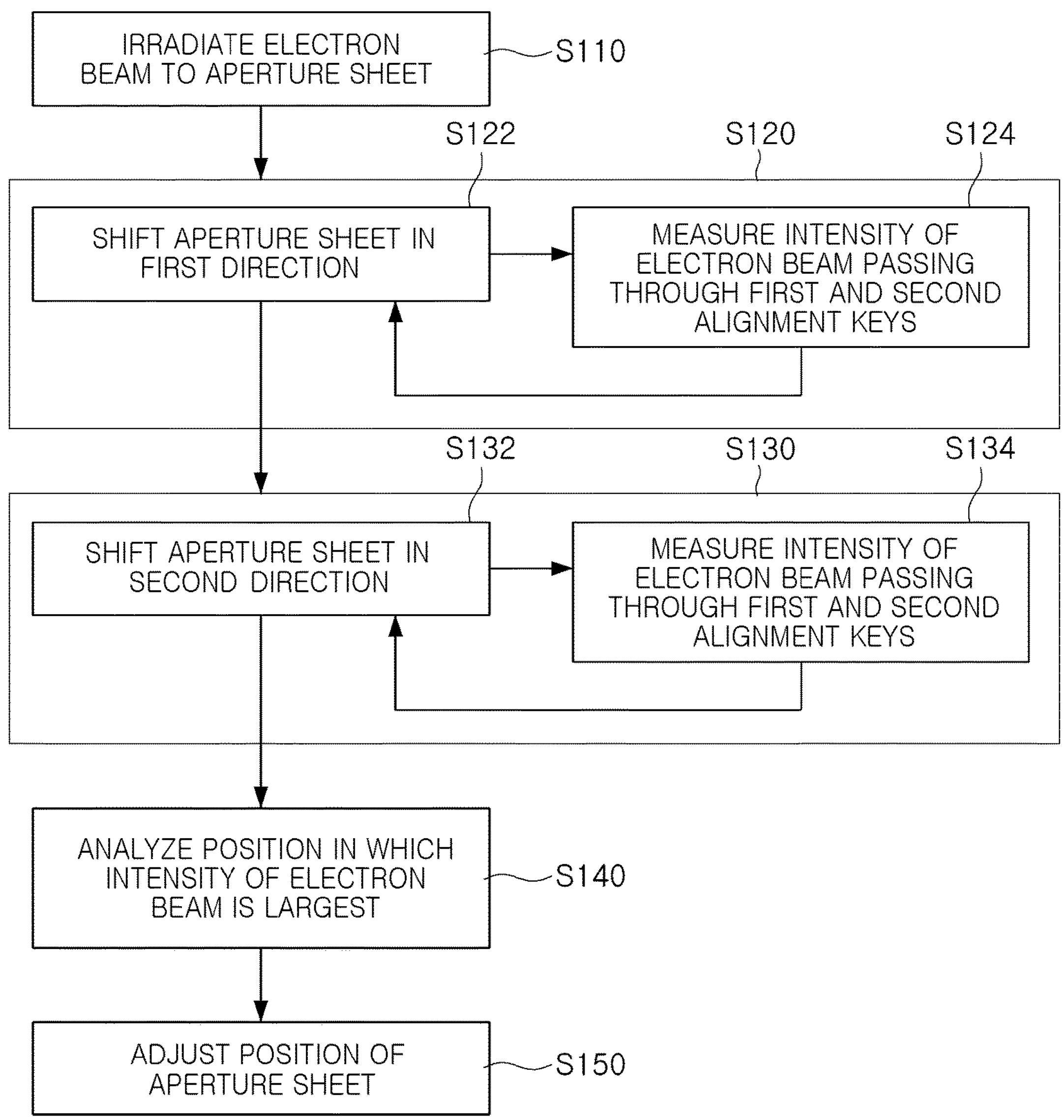
FIG. 6 is a flowchart illustrating a method of controlling alignment of aperture sheets in an aperture system, according to example embodiments.

FIG. 6 is a flowchart illustrating a method of controlling alignment of aperture sheets in an aperture system according to example embodiments.

Referring to FIG. 6, a method of controlling alignment of aperture sheets includes irradiating an electron beam EB to the aperture sheets (operation S110), measuring the intensity of the electron beam EB while shifting an aperture sheet in the first direction (operation S120), measuring the intensity of the electron beam EB while shifting the aperture sheet in the second direction (operation S130), analyzing a position in which the intensity of the electron beam EB is strongest (operation S140), and adjusting a position of the aperture sheets (operation S150). The first and second directions are perpendicular to one another, and parallel to a top surface of the substrate SUB.

In operation S110 of irradiating an electron beam EB to the aperture sheets, an electron beam EB may be irradiated to the plurality of aperture sheets from an electron beam source such as the electron gun 20 as described above with reference to FIG. 1. The electron beam EB may travel through the first and second alignment keys AK1 and AK2 in the aperture sheets.

In operation S120 of measuring the intensity of the electron beam EB while shifting an aperture sheet in the first direction, a process of shifting one aperture sheet of the plurality of aperture sheets in the first direction (operation S122) and of measuring the intensity of the electron beam EB which has passed through the first and second alignment keys AK1 and AK2 of the plurality of aperture sheets (operation S124) may be repeatedly performed, but a specific method is not limited thereto. According to example embodiments, the intensity of the electron beam EB may be measured, while sequentially shifting the apertures sheets one by one, but a specific method is not limited thereto. According to example embodiments, the foregoing operations may be repeatedly performed on two or more aperture sheets simultaneously.

In operation S122 of shifting one aperture sheet in the first direction, one aperture sheet may be shifted by a predetermined distance in the first direction using the adjustment unit 70 of FIG. 1, for example. In operation S124 of measuring the intensity of the electron beam EB which has passed through the first and second alignment keys AK1 and AK2, the intensity of the electron beam EB which has passed through the first and second alignment keys AK1 and AK2 arranged in positions corresponding vertically to the position to which the one aperture sheet has shifted may be measured. For example, when the first aperture sheet 110 of FIG. 3A is shifted, the intensity of the electron beam EB which arrives through the first alignment key AK1 of the first aperture sheet 110 may be measured. The intensity of the electron beam EB, including a maximum intensity of the electron beam EB, may be measured by the measurement unit 80 of FIG. 1, for example. In order to measure increments and decrements of the intensity of the electron beam EB, such shifting and measurement may be repeatedly performed.

In operation S130 of measuring the intensity of the electron beam EB while shifting the aperture sheet in the second direction, a process of shifting one of the aperture sheets in a second direction (operation S132) and of measuring the intensity of the electron beam EB passing through the first and second alignment keys AK1 and AK2 of the aperture sheets (operation S134) may be repeatedly performed. This operation may be performed on the aperture sheet which has shifted in operation S120, and similarly to operation S120, shifting of the aperture sheet and measurement of the intensity of the electron beam EB may be repeatedly performed.

According to certain example embodiments, operation S120 and operation S130 may be performed as a single operation. For example, the intensity of the electron beam EB may be measured, while simultaneously shifting the aperture sheet in the first direction and/or the second direction. In some embodiments, the intensity of the electron beam EB may be measured continuously and simultaneously while the aperture sheet is shifted in the first direction and/or the second direction.

In operation S140 of analyzing a position in which the intensity of the electron beam EB is largest, a position in which the intensity of the electron beam EB passing through the first alignment key of the aperture sheets is measured to be largest may be analyzed. The position in which the intensity of the electron beam EB is largest may be a directly measured position or a position calculated from a measured position. For example, if two aperture sheets are accurately aligned, the intensity of the electron beam EB which is measured on a lower side of the aperture system 40 after passing through the first alignment keys AK1 of the two aperture sheets appears to be largest, whereby correct alignment positions of the aperture sheets may be derived. This operation may be performed, for example, by the controller 90 of FIG. 1. For example, the controller 90 may derive a position of the aperture sheets based on a maximum intensity measured by the measuring unit 80.

In operation S150 of adjusting the position of the aperture sheet, the aperture sheet is shifted to the derived position in which the intensity of the electron beam EB is largest. This operation may be performed, for example, by the adjustment unit 70 of FIG. 1.

By determining any one of the aperture sheets as a reference and performing operations S110 to S150 on other aperture sheets, the position of each aperture sheet may be determined, and all the aperture sheets may be accurately aligned.

Figure 7A:
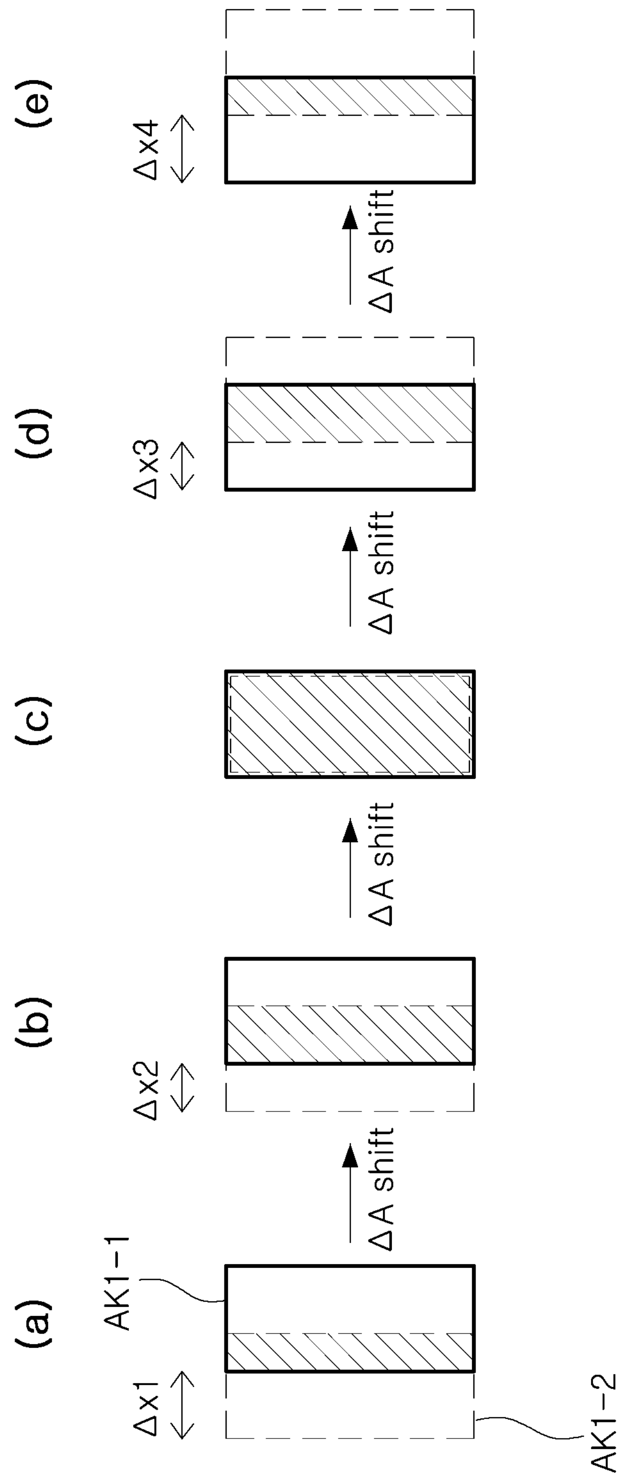
FIGS. 7A and 7B are views illustrating a method of controlling alignment of aperture sheets in an aperture system, according to example embodiments.
Figure 7B:
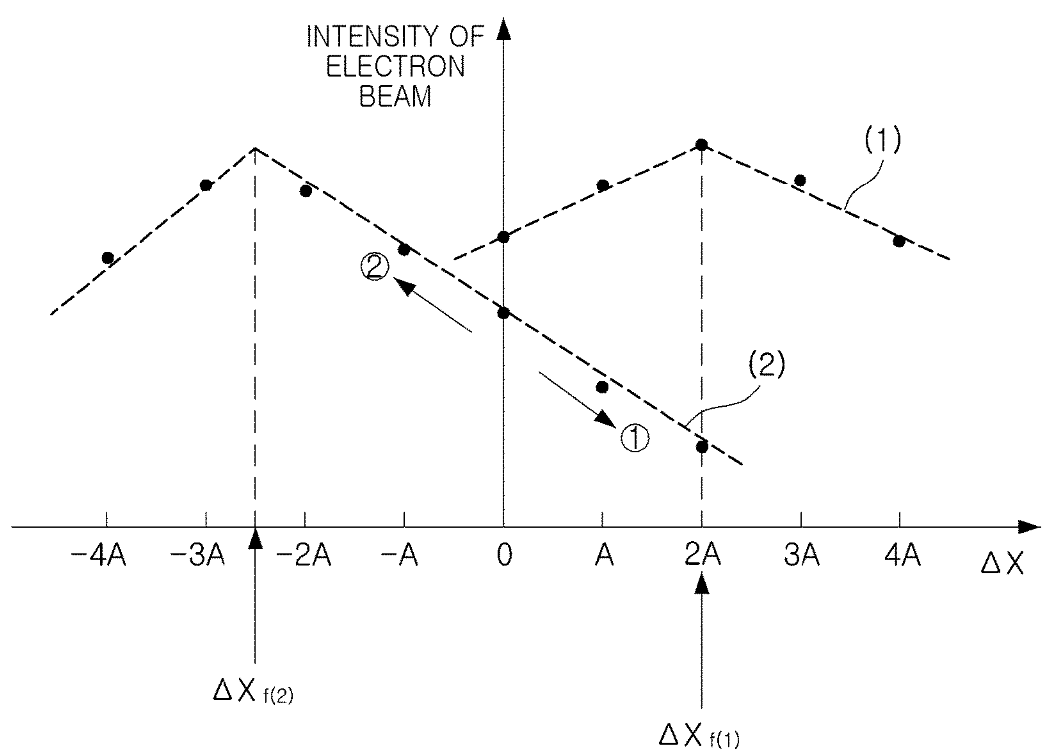

FIGS. 7A and 7B are views illustrating a method of aligning aperture sheets in an aperture system according to example embodiments.

A method of aligning aperture sheets by applying the method of aligning aperture sheets as described above with reference to FIG. 6 will be described in detail with reference to FIGS. 7A and 7B. As illustrated in FIG. 7A, the intensity of an electron beam EB passing through the first alignment keys AK1 of two aperture sheets may be measured, while shifting one aperture sheet in a rightward direction (e.g., a first direction). A first alignment key AK1-1 of the first aperture sheet and a first alignment key AK1-2 of the second aperture sheet may be arranged in positions corresponding to each other. The first alignment key AK-1 of the first aperture sheet is an alignment key for aligning the first aperture sheet with the second aperture sheet, and the first alignment key AK1-2 of the second aperture sheet may be an alignment key for aligning the second aperture sheet with the first aperture sheet.

At an initial measurement position, the second aperture sheet may be in a position shifted by Δx1 to the left of the first aperture sheet (e.g., the leftward direction). Here, the electron beam EB passing through the first alignment keys AK1-1 and AK1-2 may pass through the overlap area of the first alignment keys AK1-1 and AK1-2. Next, the operation of measuring the intensity of the electron beam EB while moving the second aperture sheet by ΔA in the rightward direction, may be repeatedly performed. The rightward direction and the leftward direction may be directly opposite one another (e.g., 180 degrees different). As the second aperture sheet is continuously shifted by ΔA, misalignment may be reduced from Δx1 to Δx2, reduced to be close to 0, and then increased to Δx3 and Δx4. For example, at the initial position, as in (a), the second aperture sheet may be offset from the first aperture sheet by Δx1, when the second aperture sheet is shifted by A, as in (b), the second aperture sheet may be offset from the first aperture sheet by Δx2, when the second aperture sheet is shifted by 2A, as in (c), the second aperture sheet may be close to zero, when the second aperture sheet is shifted by 3A, as in (d), the second aperture sheet may be offset from the first aperture sheet by Δx3, and when the second aperture sheet is shifted by 4A, as in (e), the second aperture sheet may be offset from the first aperture sheet by Δx4.

The change in the intensity of the electron beam EB measured while shifting the second aperture sheet, as discussed in connection with FIG. 7A, may be expressed as a graph (1) in FIG. 7B. In FIG. 7B, the horizontal axis represents the shifting of the second aperture in the left direction (e.g., −4A, −3A, −2A, and −A) and right direction (e.g., A, 2A, 3A, and 4A) with respect to the original position “0”, and the vertical axis represents the intensity of the electron beam EB. As shown in FIG. 7B, the intensity of the electron beam EB may be maximized when the shifting distance of the second aperture sheet is 2A, for example, when misalignment is close to zero. According to the measurement result, the position of the second aperture sheet in the rightward direction may be determined as a position ($\Delta X_{f(1)}$) shifted by 2A. A position of the second aperture sheet may be determined in the same manner also in the directions perpendicular to the rightward direction.

The graph of (2) in FIG. 7B shows a change in intensity of the electron beam EB according to another example embodiment. First, after the second aperture sheet was shifted by A (direction ①), the intensity of the electron beam EB was measured to be decreased, and also, as the second aperture sheet was shifted to 2A, the intensity of the electron beam EB continued to decrease. In another example, the electron beam EB may be measured while the second aperture sheet is shifted by A in the opposite direction (direction ②). In this case, the electron beam EB tended to increase and then decrease, and this may be analyzed by a function to predict that the electron beam EB has a maximum value in the position to which the second aperture sheet has shifted by about −2.5A. According to this analysis result, the position of the second aperture sheet may be determined as a position ($\Delta X_{f(2)}$) to which the second aperture sheet was shifted by 2.5A in the opposite direction (direction ②).

Figure 8A:
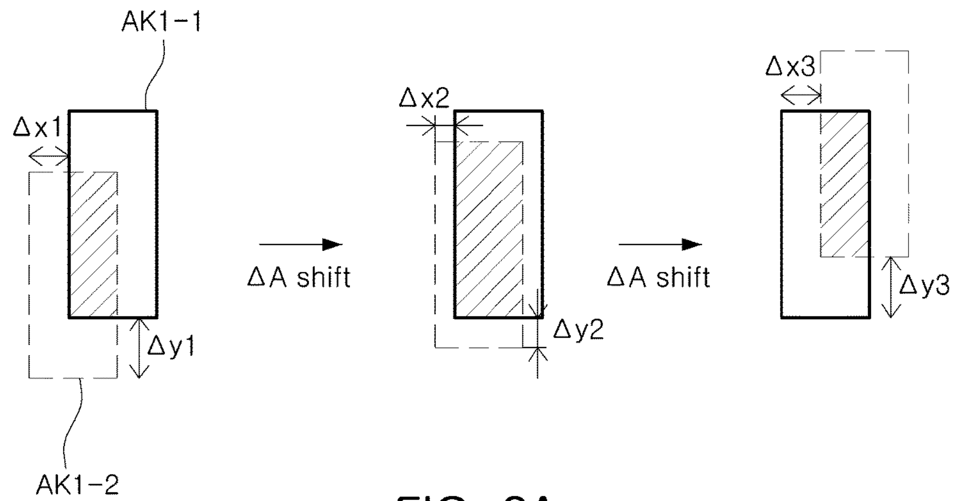
FIGS. 8A and 8B are views illustrating a method of controlling alignment of aperture sheets in the aperture system, according to example embodiments.
Figure 8B:
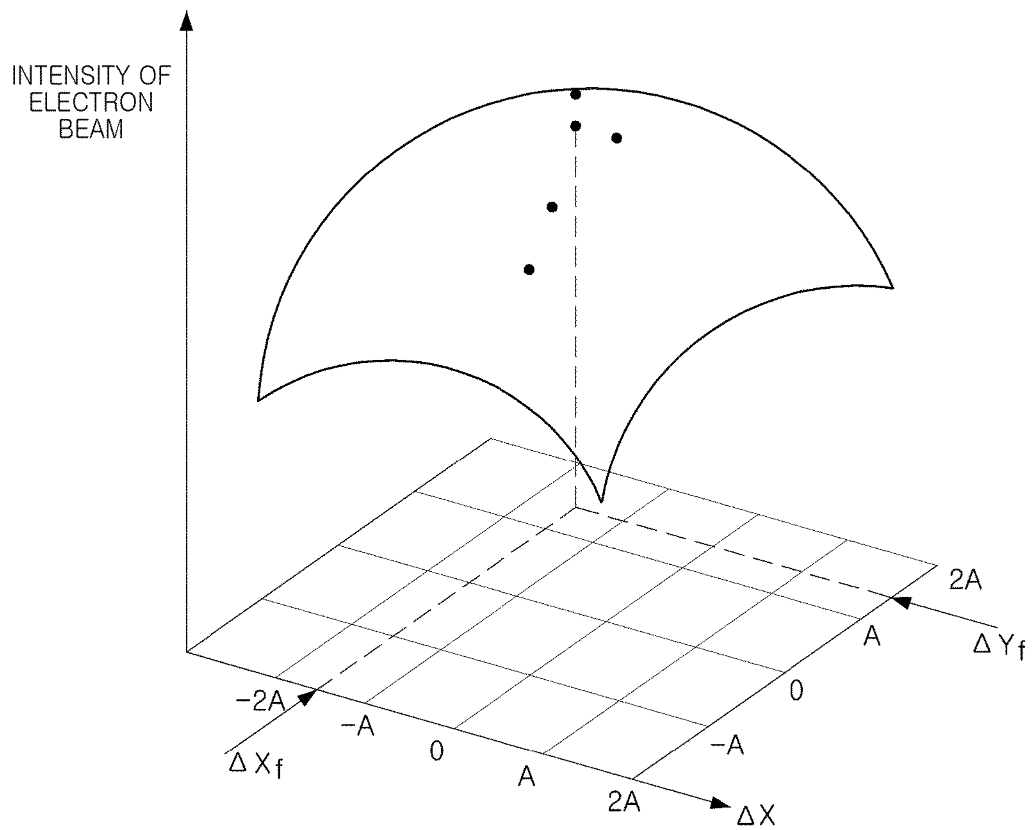

FIGS. 8A and 8B are views illustrating a method of controlling alignment of aperture sheets in an aperture system according to example embodiments.

A method of aligning aperture sheets by applying the method of controlling alignment of aperture sheets described above with reference to FIG. 6 will be described in detail with reference to FIGS. 8A and 8B. As illustrated in FIG. 8A, the intensity of the electron beam EB passing through the first alignment keys AK1 of two aperture sheets may be measured, while shifting one of the two aperture sheets. In this example embodiment, unlike the example embodiment of FIG. 7A, the intensity of the electron beam EB may be measured, while simultaneously shifting the aperture in two directions perpendicular to each other (e.g., an x-direction and a y-direction, both of which are parallel to a top surface of the substrate SUB).

At a first measurement position, the second aperture sheet is placed in a position shifted by Δx1 to the left of the first aperture sheet and shifted by Δy1 to the lower side. Here, the electron beam EB passing through the first alignment keys AK1-1 and AK1-2 may pass through the overlap area of the first alignment keys AK1-1 and AK1-2. Next, measuring the intensity of the electron beam EB, while shifting the second aperture sheet by ΔA in a diagonal direction (e.g., in both the x-direction and the y-direction), may be repeatedly performed. As the second aperture sheet is moved, misalignment may decrease to Δx2 and Δy2 and then increase again to Δx3 and Δy3.

The change in the intensity of the electron beam EB measured while shifting the aperture sheet, may be represented by the dots in FIG. 8B. From this, a 3D graph of the intensity distribution of the electron beam EB may be obtained and positions $\Delta X_f$ and $\Delta Y_f$ at which the intensity of the electron beam EB is maximized may be derived. Accordingly, the position of the second aperture sheet may be adjusted to be shifted to the foregoing position.

By improving alignment of the plurality of aperture sheets, an aperture system of an electron beam apparatus with improved accuracy, and an electron beam exposure apparatus and an electron beam exposure apparatus system including the same may be provided.

While example embodiments have been shown and described above, it will be apparent to those skilled in the art that modifications and variations could be made without departing from the scope of the present inventive concept as defined by the appended claims.

What is claimed is:

1. An aperture system of an electron beam apparatus, the aperture system comprising:

a plurality of aperture sheets, each of the plurality of apertures sheets including a first area including at least one through hole allowing an electron beam to pass therethrough and a second area disposed outside the first area and including first and second alignment keys, wherein first and second aperture sheets, among the plurality of aperture sheets, respectively include the first alignment keys arranged in mutually overlapping positions and having the same size, and wherein a third aperture sheet, among the plurality of aperture sheets, includes the second alignment keys arranged to overlap the first alignment keys of the first and second aperture sheets and having an area larger than an area of the first alignment keys of the first and second aperture sheets.

2. The aperture system of claim 1, wherein the first and second alignment keys are in the form of an opening through which the electron beam passes.

3. The aperture system of claim 1, wherein the first alignment keys have a rectangular shape.

4. The aperture system of claim 1, wherein the first and second aperture sheets respectively further include the first alignment keys respectively corresponding to other aperture sheets of the plurality of aperture sheets and the second alignment keys arranged to overlap the first alignment keys of other aperture sheets of the plurality of aperture sheets.

5. The aperture system of claim 4, wherein in each of the first and second aperture sheets, the first and second alignment keys are arranged in a row.

6. The aperture system of claim 4, wherein when a number of the plurality of aperture sheets are n, a total number of the first and second alignment keys in each of the first and second aperture sheets is $(n^2-n)/2$.

7. The aperture system of claim 6, wherein in each of the first and second aperture sheets, the number of the first alignment keys is n−1.

8. The aperture system of claim 1, wherein each of the first alignment keys includes a first opening extending in a first direction and a second opening extending in a second direction.

9. The aperture system of claim 1, wherein the first area is an area through which the electron beam passes, and the second area is a dummy area.

10. The aperture system of claim 1, further comprising: at least one additional aperture sheet not including the first and second alignment keys.

11. The aperture system of claim 1, wherein the plurality of aperture sheets include a shaping aperture sheet and a blanking aperture sheet.

12. The aperture system of claim 11, further comprising: an electrode coupled to the blanking aperture sheet.

13. An electron beam exposure apparatus comprising:

an electron gun emitting an electron beam toward a substrate;

a lens unit arranged between the substrate and the electron gun and focusing the electron beam; and a plurality of aperture sheets arranged between the substrate and the lens unit, wherein first and second aperture sheets, among the plurality of aperture sheets, each include first alignment keys arranged in mutually overlapping positions and having the same size, and wherein at least one third aperture sheet, among the plurality of aperture sheets, includes second alignment keys arranged to overlap the first alignment keys and having an area larger than an area of the first alignment keys.

14. The electron beam exposure apparatus of claim 13, wherein the first and second alignment keys are in the form of an opening through which the electron beam passes.

15. An electron beam exposure apparatus system comprising:

a plurality of aperture sheets each including a first area including at least one through hole allowing an electron beam to pass therethrough and a second area including first and second alignment keys arranged outside the first area;

a measurement unit measuring the intensity of the electron beam passing through the plurality of aperture sheets; and an adjustment unit adjusting positions of the plurality of aperture sheets, wherein first and second aperture sheets, among the plurality of aperture sheets, include the first alignment keys arranged in mutually overlapping positions and having the same size, and wherein a third aperture sheet, among the plurality of aperture sheets, includes the second alignment keys arranged to overlap the first alignment keys of the first and second aperature sheets and having an area larger than an area of the first alignment keys of the first and second aperture sheets.

16. The electron beam exposure apparatus system of claim 15, wherein the intensity of the electron beam passing through the first and second alignment keys is measured by the measurement unit, while the position of the second aperture sheet is shifted in at least one direction by the adjustment unit.

17. The electron beam exposure apparatus system of claim 16, wherein the measurement unit measures a maximum intensity of the electron beam, the system further comprising:

a controller deriving a position of the second aperture sheet based on the maximum intensity measured by the measurement unit.

18. The electron beam exposure apparatus system of claim 17, wherein the adjustment unit shifts the position of the second aperture sheet according to the derived position of the second aperture sheet.

19. The electron beam exposure apparatus system of claim 15, wherein the plurality of aperture sheets are arranged as a plurality of groups of aperture sheets spaced apart from each other, and wherein each group of aperture sheets includes at least one of the first aperture sheet or the second aperture sheet.

20. The electron beam exposure apparatus system of claim 19, wherein the adjustment unit adjusts positions of the groups of aperture sheets relative to one another by shifting all aperture sheets in each group of aperture sheets together.

* * * * *